United States Patent
Kasai et al.

(10) Patent No.: US 6,441,394 B2
(45) Date of Patent: Aug. 27, 2002

(54) INTRINSIC JOSEPHSON SUPERCONDUCTING TUNNEL JUNCTION DEVICE

(75) Inventors: Yuji Kasai; Shigeki Sakai, both of Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 37 days.

(21) Appl. No.: 09/746,767

(22) Filed: Dec. 26, 2000

(30) Foreign Application Priority Data

Mar. 24, 2000 (JP) .......................... 2000-084421

(51) Int. Cl.[7] .......................... H01L 31/0256
(52) U.S. Cl. .......................... 257/31; 505/779; 505/782
(58) Field of Search .................. 257/31, 623; 505/776, 505/779, 782

(56) References Cited

U.S. PATENT DOCUMENTS 5,401,717 A * 3/1995 Lay .......................... 505/782
5,508,252 A * 4/1996 Fukushima et al. ......... 505/782
5,886,778 A    3/1999 Kasai et al.

FOREIGN PATENT DOCUMENTS

| EP | 0 562 601 | * 9/1993 | .............. 257/31 |
| JP | 10233536 | 2/1998 | |
| JP | 10-132736 | 5/1998 | |

OTHER PUBLICATIONS

"Intrinsic Josephson effects in high–T, superconductors" Kleiner et al., Physical Review B, Jan. 1, 1994–II, pp. 1327–1341.

* cited by examiner

Primary Examiner—Mark V. Prenty
(74) Attorney, Agent, or Firm—Venable; Robert J. Frank

(57) ABSTRACT

Using an oxide superconductor that does not require cryogenic temperatures, a superconducting tunnel junction device is provided which can accurately control the magnitudes of critical current and step voltage necessary for electronics applications and which has good characteristics as designed. The intrinsic Josephson superconducting tunnel junction device includes an oxide superconductor defined by a general expression (I): $Bi_{2-z}Pb_zSr_2Ca_{n(1-x)}R_{nx}Cu_{n+1}O_{2n+6}$ ($n \geq 1$, $0 < x \leq 0.2$, $0 \leq z \leq 1.0$, R: rare-earth element).

23 Claims, 5 Drawing Sheets

INTRINSIC JOSEPHSON SUPERCONDUCTING TUNNEL JUNCTION DEVICE

This application is based on Patent Application No. 2000-084421 filed Mar. 24, 2000 in Japan, the content of which is incorporated hereinto by reference.

BACKGROUND OF THE INVENTION

1. Field of the Invention

The present invention relates to an intrinsic Josephson superconducting tunnel junction device and more specifically to an intrinsic Josephson superconducting tunnel junction device using an oxide superconductor including at least bismuth as a constitutional element.

2. Description of the Related Art

Conventionally known superconducting tunnel devices are generally classified into those using a metal superconductor and those using an oxide superconductor.

The superconducting tunnel junction devices using the metal superconductor use a metal oxide in a barrier layer and some of them are already in practical use. However, they have a drawback that because of a very low critical temperature for superconductivity, the environment in which the superconducting tunnel junction devices of this category can be used is significantly limited.

Among the known superconducting tunnel junction devices using the oxide superconductor, particularly those using an oxide superconductor with a critical temperature for superconductivity of 80 K or higher, are (1) a step-edge-type junction device that has a superconductor layer formed over a substrate with a very small step structure and utilizes the stepped portion of the superconductor, (2) a grain-boundary-type junction device using a grain boundary formed in a thin layer of superconductor as a barrier layer, (3) a stacked-type junction device having an insulating barrier layer sandwiched between superconductor layers, and (4) an intrinsic Josephson junction device that uses a natural superlattice crystal structure characteristic of a single crystal of a bismuth-based oxide superconductor.

To allow the superconducting tunnel junction devices to be used widely in the field of electronics generally requires the use of materials not requiring ultralow temperatures. The aforementioned oxide superconductor meets at least this requirement and thus has been under active research and development. Although many test products using the oxide superconductor have been developed, they are not provided in an industrially applicable form.

That is, in the superconductive tunnel junction devices using the oxide superconductor which have conventionally been test-manufactured, the step-edge-type junction device, the grain-boundary-type junction device and the stacked-type junction device have a drawback that their hysteresis curves of current-voltage characteristics are significantly deviated from an ideal characteristic based on the Josephson effect, with the characteristics jumping from a voltage state to a zero voltage state at a large current value, making it impossible to provide necessary characteristics for electronics applications.

As to the intrinsic Josephson junction devices, the proportional relation in the current-voltage characteristic (geometry of characteristic curve) is generally good, but an accurate control of the magnitudes of the critical current value and step voltage has not yet realized. Further, because the natural superlattice crystal structure is used, a plurality of superconducting tunnel junctions are stacked in series. It is therefore not easy to precisely control the number of junctions (stack number), giving rise to a problem that in the electronics applications the devices produced will fail to exhibit electric characteristics as designed.

To solve these problems, Japanese Patent Application Laid-open No. 10-233536 (1998) discloses a superconducting tunnel junction device having a barrier layer made mainly of a composite oxide generally expressed as $Bi_2A_{m+1}Cu_mO_{2m+4}$ (A is at least one kind of alkaline earth element and m is an integer equal to or less than 4). An example of the barrier layer includes $Bi_2Sr_2Ca_{0.6}Y_{0.4}Cu_2O_8$, $Bi_2Sr_2CaCu_2O_8$, $Bi_2(La_{0.6}Sr_{0.4})_2CuO_6$, and $Bi_2Sr_2CuO_5$.

This junction device exhibits a typical Josephson characteristic with a definite hysteresis and has a good superconducting tunnel junction characteristic. It belongs to the stacked-type junction device (item (3) above) having an insulating barrier layer sandwiched between superconductor layers and differs from the category of the intrinsic Josephson junction device (item (4) above). The method for accurate control of the magnitudes of the critical current and step voltage has not been realized and a precise control of the number of junctions (stack number) is not easy. Hence, there still is a problem with this junction device that in electronics applications the devices produced will not be able to exhibit the electric characteristics as designed.

SUMMARY OF THE INVENTION

In light of the aforementioned problems, it is an object of the present invention to provide an intrinsic Josephson superconducting tunnel junction device which uses an oxide superconductor not requiring cryogenic temperatures such as liquid helium temperature and which is capable of precise control of the magnitudes of critical current and step voltage necessary for electronics applications and has good as-designed characteristics.

To solve the aforementioned problems, the inventors of this invention have conducted many years of research and unexpectedly have found that the use of an oxide superconductor layer doped with a particular amount of rare-earth element, particularly yttrium (Y), is effective in limiting to the layer of oxide superconductor the intrinsic Josephson effect observed in bismuth (Bi)-based oxide superconductor. This has led to the present invention.

First, according to the first aspect, the present invention provides an intrinsic Josephson superconducting tunnel junction device that includes an oxide superconductor defined by a general expression (I): $Bi_{2-z}Pb_zSr_2Ca_{n(1-x)}R_{nx}Cu_{n+1}O_{2n+6}$ ($n \geq 1$, $0 < x \leq 0.2$, $0 \leq z \leq 1.0$, R: rare earth element).

A second aspect of the present invention provides an intrinsic Josephson superconducting tunnel junction device wherein R in the general expression (I) is yttrium (Y).

A third aspect of the present invention provides an intrinsic Josephson superconducting tunnel junction device wherein, in the first or second aspect, n in the general expression (I) is 1.

A fourth aspect of the present invention provides an intrinsic Josephson superconducting tunnel junction device wherein, in the second or third aspect, a layer of the oxide superconductor is stacked at each side with other oxide superconductors.

A fifth aspect of the present invention provides an intrinsic Josephson superconducting tunnel junction device wherein, in the fourth aspect, the other oxide superconductors are Bi-based oxide superconductors having Bi, Sr, Ca, Cu and O as its main components.

A sixth aspect of the present invention provides an intrinsic Josephson superconducting tunnel junction device wherein, in the fifth aspect, the Bi-based oxide superconductor has a composition expressed by a general expression (II): $Bi_2Sr_2Ca_1Cu_2O_8$.

A seventh aspect of the present invention provides an intrinsic Josephson superconducting tunnel junction device wherein, in any one of the first to sixth aspect, a structure of the junction device is a mesa structure.

According to this invention, by using a layer of an oxide superconductor doped with a particular amount of rare-earth element such as yttrium to limit the intrinsic Josephson effect observed in a bismuth-based oxide superconductor to a restricted layer of oxide superconductor, it is possible to realize a superconducting tunnel junction device which can precisely control the magnitudes of critical current and step voltage necessary for electronics applications where the device needs to be able to operate without requiring cryogenic environments, and which has good characteristics as designed.

Further, the characteristics of the superconducting tunnel junction device can be controlled by adjusting the amount of rare-earth element doped, such as yttrium (Y); the number of stacks of the superconducting tunnel junction can be controlled by only the thickness of a thin film doped with yttrium (Y) which forms a hetero-structured film; and these characteristics do not depend on the height of the mesa structure. These features provide another advantage that the mesa structure can be fabricated with much greater ease than in the conventional method.

Further, when oxide superconductors other than the bismuth-based oxide superconductor are used for the electrode/wiring materials, there is an advantage that the oxide superconductors forming the superconducting tunnel junction device and the electrode/wiring portions can be formed integral, simplifying the electronic circuits using the superconducting tunnel junction and facilitating the manufacture of the electronic circuits.

The above and other objects, features and advantages of the present invention will become more apparent from the following description of embodiments thereof taken in conjunction with the accompanying drawings.

DESCRIPTION OF THE PREFERRED EMBODIMENTS

Now, embodiments of the present invention will be described by referring to the accompanying drawings.

The superconducting tunnel junction device of this invention is characterized in that it contains an oxide superconductor given by a general expression (I): $Bi_{2-z}Pb_zSr_2Ca_{n(1-x)}R_{nx}Cu_{n+1}O_{2n+6}$ ($n \geq 1$, $0 < x \leq 0.2$, $0 \leq z \leq 1.0$, R: rare earth element).

The inventors of this invention formed a single crystal, the composition of which is generally expressed as $Bi_{2-z}Pb_zSr_2Ca_{n(1-x)}R_{nx}Cu_{n+1}O_{2n+6}$ (general expression (I); symbols are the same as above), by replacing a part of calcium (Ca) of the bismuth-based oxide superconductor generally expressed as $Bi_{2-z}Pb_zSr_2Ca_nCu_{n+1}O_{2n+6}$ (general expression (III); symbols are the same as above) with a rare-earth element such as yttrium (Y), and used this single crystal to manufacture an intrinsic Josephson junction. The inventors have encountered an unexpected finding that the intrinsic Josephson junction thus fabricated exhibits a characteristic different from that of the junction device with the general expression of (III) in terms of a critical current density and a critical voltage.

In the above general expressions (I) and (III), the content of oxygen (O) is expressed as $O_{2n+6}$ but this is a basic composition. The bismuth-based oxide superconductor also includes those compositions whose oxygen contents are slightly modified, such as $O_{2n+6+\delta}$ ($0 \leq \delta \leq 0.5$).

Figure 1:
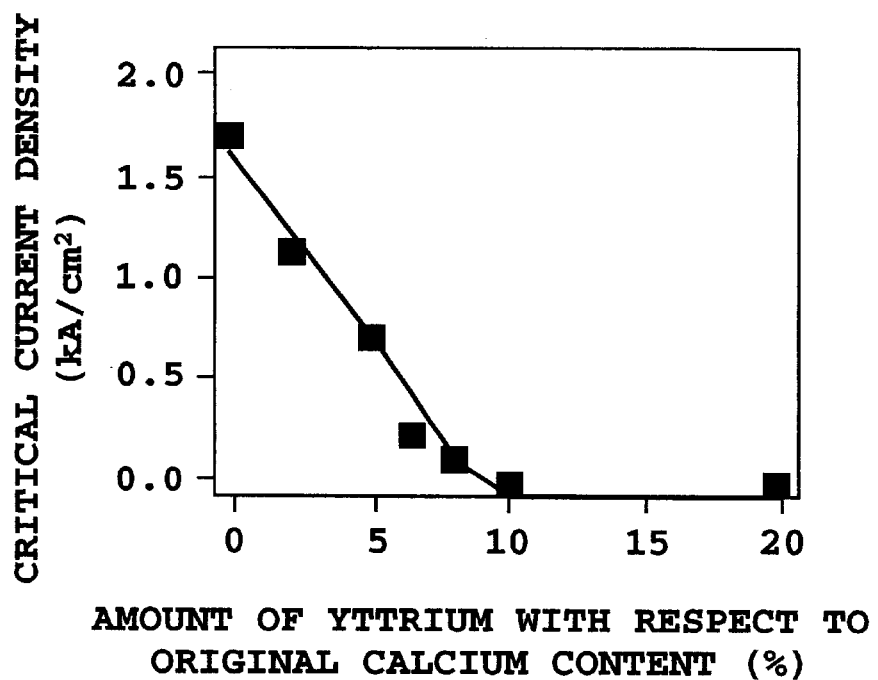
FIG. 1 illustrates a result of experiment showing a change in a critical current density in the intrinsic Josephson effect when a part of Ca in a bismuth-based oxide superconductor is replaced with yttrium (Y).
Figure 2:
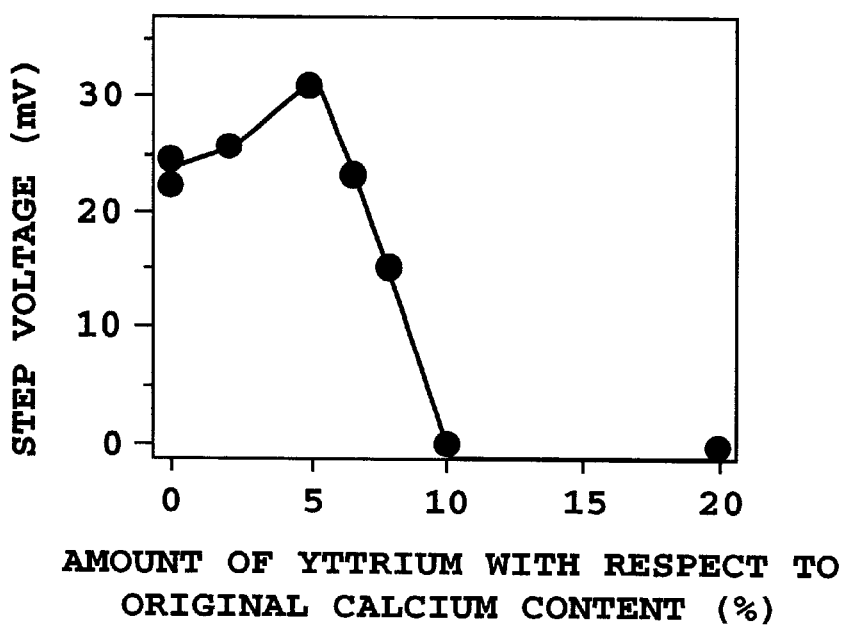
FIG. 2 illustrates a result of experiment showing a change in a step voltage in the intrinsic Josephson effect when a part of Ca in a bismuth-based oxide superconductor is replaced with yttrium (Y).

FIGS. 1 and 2 show how the characteristics change, with FIG. 1 representing a change in the critical current density and FIG. 2 representing a change in the step voltage.

FIG. 1 indicates that in a junction device formed of a bismuth-based oxide superconductor generally expressed as $Bi_2Sr_2Ca_nCu_{n+1}O_{2n+6}$ (general expression III-a, which is the general expression III with z changed to 0), when yttrium (Y) is not added, the critical current density is at a constant value of 1.7 kA/cm$^2$ and that when a part of calcium (Ca) is replaced with yttrium (Y), the current density continuously decreases according to the amount replaced and becomes almost zero when the replaced amount reaches 10%.

It is also found from FIG. 2 that the magnitude of the Josephson voltage step gradually increases until the yttrium (Y) replacement amount reaches 5%, at which time the voltage step is 1.2 times that of the Josephson junction device with no yttrium (Y), and that after the yttrium (Y) replacement amount exceeds 5%, the voltage step decreases with an increase in the yttrium (Y) replacement amount.

The critical temperature of the intrinsic Josephson junction with the general expression of (I) is generally 70 K or higher, and particularly the intrinsic Josephson junctions with the Y replacement amount of 5% ore less has the critical temperature of 87 K or higher, which is almost comparable to 88 K, the critical temperature of the junction device formed of the bismuth-based oxide superconductor expressed by the general expression III-a of $Bi_2Sr_2Ca_nCu_{n+1}O_{2n+6}$.

Therefore, the bismuth-based oxide superconductor with the general expression (I) of $Bi_{2-z}Pb_zSr_2Ca_{n(1-x)}R_{nx}Cu_{n+1}O_{2n+6}$, which is made by replacing a part of calcium (Ca) of a bismuth-based oxide superconductor expressed by the general expression (III) of $Bi_{2-z}Pb_zSr_2Ca_nCu_{n+1}O_{2n+6}$ with a certain amount of rare earth element (R) such as yttrium (Y), has a high critical temperature, and it is possible to freely control its critical current density and step voltage by properly changing the amount of yttrium (Y) replacement. Hence, by using an oxide superconductor that does not require cryogenic temperatures, the magnitudes of critical current and step voltage necessary for electronics applications can be controlled accurately, and a superconducting tunnel junction device having good characteristics as designed can be produced.

The superconducting tunnel junction device used in this invention contains a bismuth-based oxide superconductor expressed by the general expression (I) of $Bi_{2-z}Pb_zSr_2Ca_{n(1-x)}R_{nx}Cu_{n+1}O_{2n+6}$ (n>1, $0<x\leq0.2$, $0\leq z\leq1.0$, R:rare earth element).

In the general expression (I), R indicates rare earth elements such as yttrium (Y), lanthanum (La), cerium (Ce), praseodymium (Pr), Neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), and preferably yttrium (Y); and n is an integer equal to or more than 1 and preferably 1 or 2.

In this invention, x, the amount of rare earth replacement, is defined to range from 0 to 0.2 and preferably from 0 to 0.1.

The reason is as follows. If x is zero, the critical current of the whole junction becomes uniform, making it impossible to operate only a limited portion. If x exceeds 0.2, the material loses its superconductivity and becomes an insulator or a semiconductor, no longer exhibiting the intrinsic Josephson effect.

The intrinsic Josephson superconducting tunnel junction device is, as described above, formed mainly of a bismuth-based oxide superconductor expressed by the general expression (I) and containing a particular amount of rare earth element such as yttrium (Y). It is preferred that the intrinsic Josephson superconducting tunnel junction device have a structure in which a layer of this oxide superconductor is stacked at each side with other oxide superconductors.

Other oxide superconductors can include any conventionally known materials, such as Bi-based oxide superconductors made mainly of Bi, Sr, Ca, Cu and O, Bi-based oxide superconductors with a part of Bi replaced with lead (Pb), Y-based oxide superconductors made mainly of Y, Ba, Cu and O, Tl-based oxide superconductors made mainly of Tl, Ba, Ca, Cu and O, Hg-based oxide superconductors made mainly of Hg, Ba, Ca, Cu and O, and Cu-based oxide superconductors made mainly of Cu, Ba, Ca and O.

Other oxide superconductors preferably used in this invention are Bi-based oxide superconductors made mainly of Bi, Sr, Ca, Cu and O, and Bi-based oxide superconductors more preferably used in this invention are the ones whose compositions are expressed by a general expression (II): $Bi_2Sr_2Ca_1Cu_2O_8$.

The tunnel junction devices made of the above combinations of superconductors have desirable features that their phase states are stable, that the superconductors are easy to manufacture, and that their critical temperatures are as high as 80 K. With these features, the above junction devices can very advantageously be used.

The intrinsic Josephson superconducting tunnel junction device of this invention can be formed in a variety of structures. Such structures include, for example, a mesa structure, a planar structure (one with the c-axis of the superconductor crystal oriented perpendicular to the substrate and one with the c-axis of the superconductor crystal oriented parallel with the substrate), a structure having a portion insulated by ion implantation, and a structure formed by a focused ion beam etching. In terms of ease of processing and integration, the mesa structure is preferred.

In manufacturing the intrinsic Josephson superconducting tunnel junction device of this invention, an appropriate substrate is used according to the structure chosen; and appropriate source materials according to the structure to be fabricated are supplied sequentially to form thin layers by setting the temperature and the supplying rate according to the materials used and by growing thin layers with conventionally known vapor phase epitaxy, spin coating and liquid phase epitaxy.

The vapor phase epitaxy includes a laser ablasion, electron beam evaporation, flush evaporation, ion plating, RF-magnetron sputtering, molecular beam epitaxy (MBE), chemical vapor deposition (CVD), plasma CVD, and metal organic chemical vapor deposition (MOCVD). The spin coating includes a sol-gel method and metal organic vapor deposition.

Now, preferred embodiments of the intrinsic Josephson superconducting tunnel junction devices of this invention and the method of manufacturing such devices will be explained by referring to the drawings.

Figure 3:
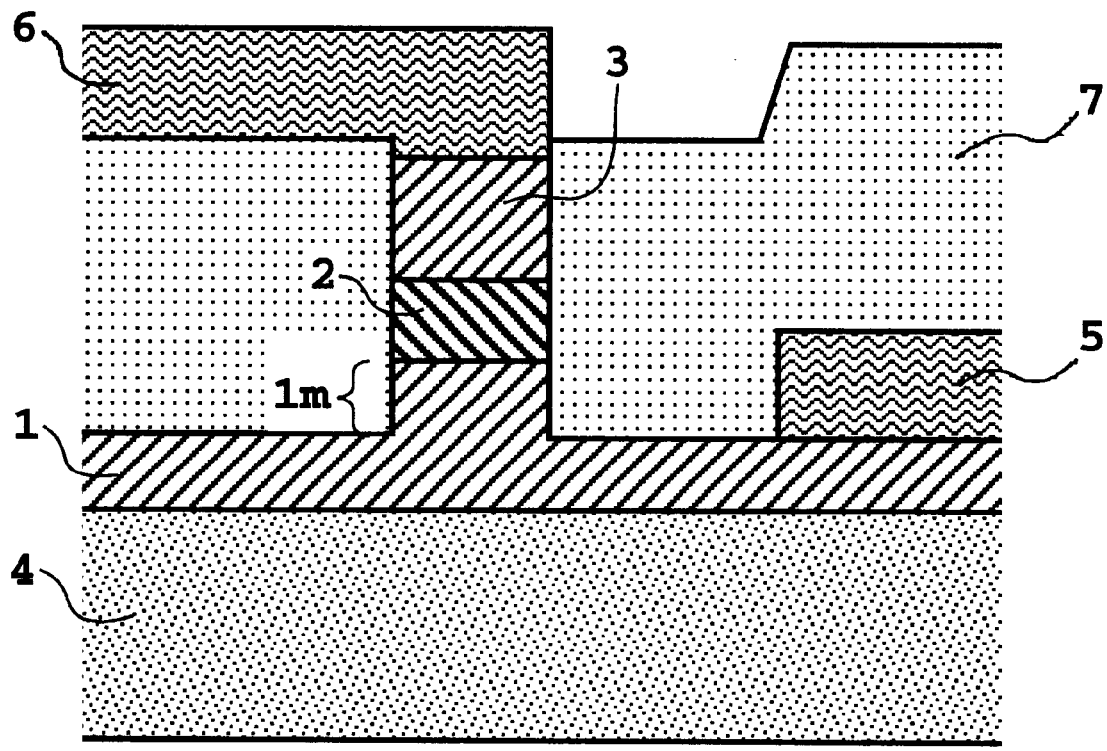
FIG. 3 illustrates a cross-sectional structure of an intrinsic Josephson superconducting tunnel junction device according to the present invention.

FIG. 3 illustrates a cross-sectional structure of a typical intrinsic Josephson superconducting tunnel junction device of this invention. In FIG. 3, reference numerals 1 and 3 represent a bismuth-based oxide superconductor, the composition of which may, for example, be expressed in chemical expression as $Bi_2Sr_2CaCu_2O_8$. Denoted 1m is a mesa structure portion of the oxide superconductor 1. Designated 2 is a bismuth-based oxide superconductor doped with yttrium (Y) which may be expressed in chemical expression as $Bi_2Sr_2Ca_{1-x}Y_xCu_2O_8$. A substrate 4 is a plate formed of strontium titanate crystal, for example. Reference number 5 denotes an electrode (lower electrode) in contact with the superconducting tunnel junction device and may be formed of gold (Au). Reference number 6 denotes another electrode (upper electrode) in contact with the superconducting tunnel junction device and may also be formed of Au. An insulator 7 electrically isolates the electrode 5 and the electrode 6 from each other and may be formed of silicon oxide (SiO).

The oxide superconductor 1 is formed over the substrate 4 and the c-axis of the crystal of the oxide superconductor 1 is preferably oriented perpendicular to the surface of the substrate 4. The bismuth-based oxide superconductor 2 doped with yttrium (Y) is epitaxially formed on the oxide superconductor 1, with the orientation of its crystal set in the same direction as the oxide superconductor 1. Similarly, the bismuth-based oxide superconductor 3 may be epitaxially formed over the bismuth-based oxide superconductor 2 doped with yttrium (Y) and the orientation of its crystal is preferably the same as that of the oxide superconductor 2.

The oxide superconductors 1, 2, 3 are of mesa structure as shown and the portions 1m, 2, 3 form intrinsic Josephson junctions.

The intrinsic Josephson junction is a junction utilizing a natural superlattice crystal structure characteristic of a single crystal of the bismuth-based oxide superconductor. In this junction an atomic layer containing copper (Cu) and calcium (Ca) in the crystal structure works as a superconducting layer and an atomic layer containing bismuth (Bi) and strontium (Sr) works as an barrier layer. The bismuth-based oxide superconductor has a crystal structure in which the atomic layer containing copper (Cu) and calcium (Ca) and the atomic layer containing bismuth (Bi) and strontium (Sr) are alternately stacked one upon the other. Natural Josephson junctions are formed in the direction of c-axis of the crystal.

An example of reference document about the intrinsic Josephson junction is the "Intrinsic Josephson effects in high-Tc superconductors" by Reinhold Kleiner and Paul Muller (Physical Review B volume 49, pp.1327–1341, 1994).

In the structure shown in FIG. 3, the intrinsic Josephson junction formed by 1m, the intrinsic Josephson junction formed by 2 and the intrinsic Josephson junction formed by 3 are electrically connected in series. In the structure of FIG. 3, the areas of these junctions 1m, 2, 3 are equal.

Figure 4A:
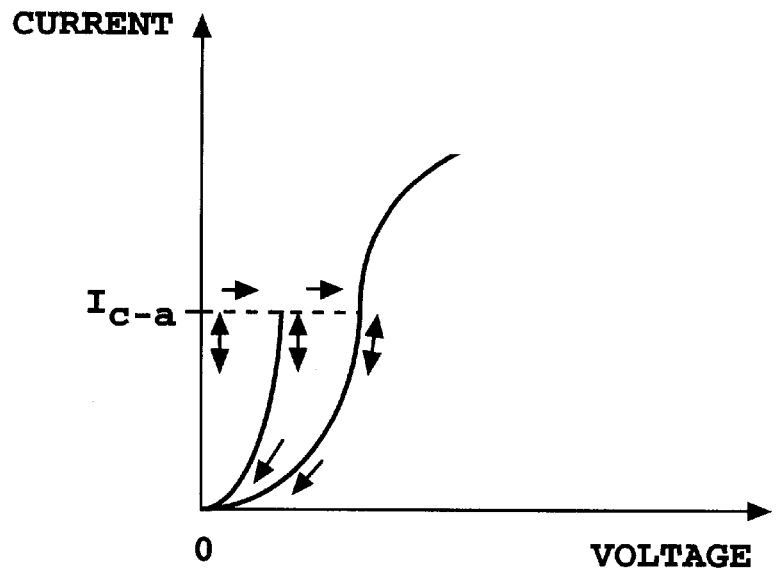
FIGS. 4A and 4B schematically show examples of a current-voltage characteristic of the intrinsic Josephson junction according to the present invention, with FIG. 4A representing an example current-voltage characteristic of the intrinsic Josephson junction doped with yttrium (Y) and FIG. 4B representing an example current-voltage characteristic of the intrinsic Josephson junction not doped with yttrium (Y).
Figure 4B:
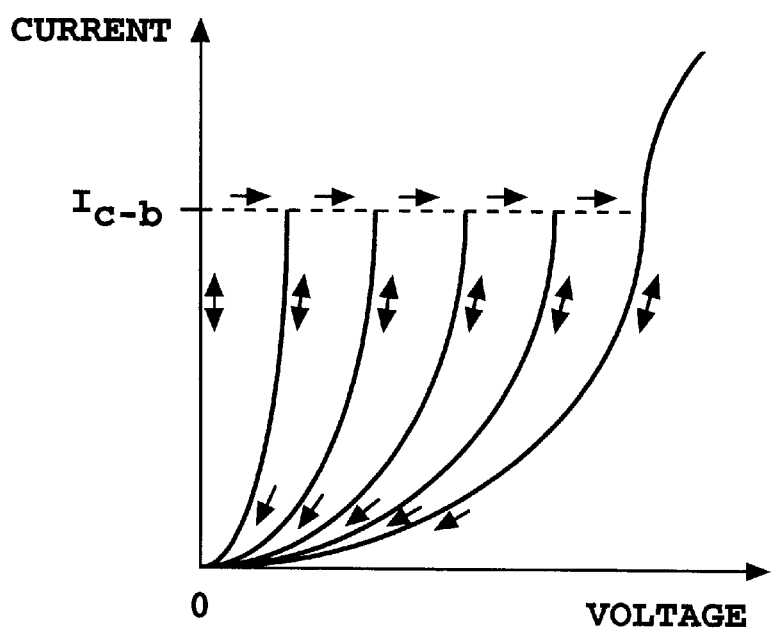

An example current-voltage characteristic of the intrinsic Josephson junction is shown in FIGS. 4A and 4B. FIG. 4A shows an example current-voltage characteristic of the intrinsic Josephson junction (represented by the portion 2 in the structure of FIG. 3) when yttrium (Y) is added. The critical current in this junction is Ic-a and the number of stacks in the junction is 2. FIG. 4B shows an example current-voltage characteristic of the intrinsic Josephson junction (represented by the portions 1m and 3 in the structure of FIG. 3) when yttrium (Y) is not added. The critical current in this junction is Ic-b and the number of stacks in the junction is 5. When the current supplied to the junction of FIG. 4B is always smaller than Ic-b, this junction is kept in a state where no voltage is produced (zero voltage state).

The number of stacks in the intrinsic Josephson junction is determined by the height of the mesa structure portion. That is, in the bismuth-based oxide superconductor 2 containing yttrium (Y), the number of Sr and Bi layers corresponds to the stack number. Further, in the bismuth-based oxide superconductor 2 the critical current Ic-a of the junction decreases according to the amount of yttrium (Y) doped, so that the Ic-a is smaller than the Ic-b and the value of Ic-a is determined by the amount of yttrium (Y) added.

The voltage produced in the superconducting tunnel junction device of the structure of FIG. 3 is the sum of the voltages of the current-voltage characteristics shown in FIG. 4A and FIG. 4B. Hence, when the current flowing through the superconducting tunnel junction device is always smaller than the Ic-b, the junction of FIG. 4B, i.e., the junction of portions 1m and 3 of FIG. 1, keeps the zero voltage state with no voltage produced. As a result, the current-voltage characteristic of the superconducting tunnel junction device becomes equal to the current-voltage characteristic of FIG. 4A. Controlling the thickness of the portion 2 in the structure of FIG. 3 doped with yttrium (Y) can easily control the number of stacks in the superconducting tunnel junction device. This can easily be realized even when the number of junctions is 1.

In this way, the control of the number of stacks in the superconducting tunnel junction can be made only by the thickness of the superconductor 2 doped with yttrium (Y) and does not depend on the height of the mesa structure, and therefore the height of the mesa structure has almost no influence on the characteristic of the junction device.

The superconducting tunnel junction device of this invention, therefore, has an excellent feature that the critical current and step voltage of the junction can be controlled by the amount of yttrium (Y) added to the superconductor 2 and that the number of stacks in the superconducting tunnel junction device can be controlled by the thickness of the superconductor 2.

Next, one example embodiment of a method for manufacturing the superconducting tunnel junction device according to this invention will be explained.

Figure 5:
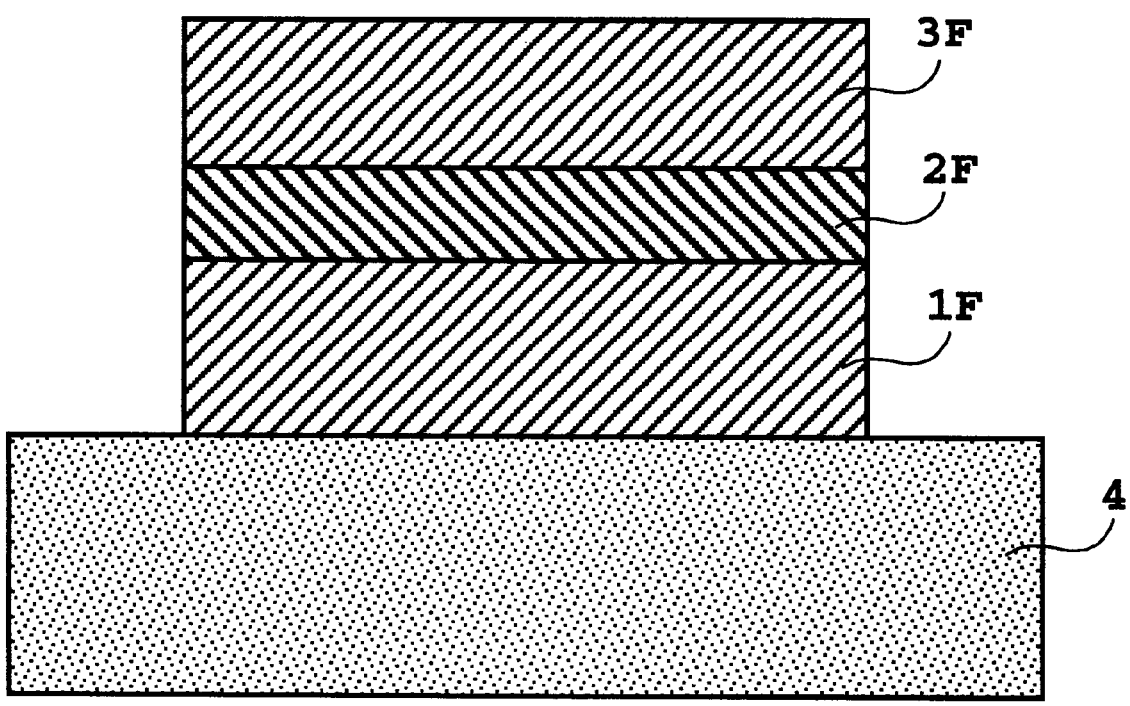
FIG. 5 illustrates a cross-sectional structure of a hetero-structured layer of an oxide superconductor which is first formed in the process of manufacturing the intrinsic Josephson superconducting tunnel junction device according to the present invention.

First, a hetero-structured film as shown in FIG. 5 is fabricated. In FIG. 5, reference number 4 denotes a substrate, and 1F and 3F represent thin films of bismuth-based oxide superconductor, the composition of which may be defined in chemical expression as $Bi_2Sr_2CaCu_2O_8$. 2F is a thin film of bismuth-based oxide superconductor whose composition may be expressed as $Bi_2Sr_2Ca_{1-x}Y_xCu_2O_8$. The substrate 4 is the same as that shown in FIG. 3.

In manufacturing the hetero structure, a variety of film forming apparatus may be used. One example configuration of the vacuum film-deposition apparatus is shown in FIG. 6.

Figure 6:
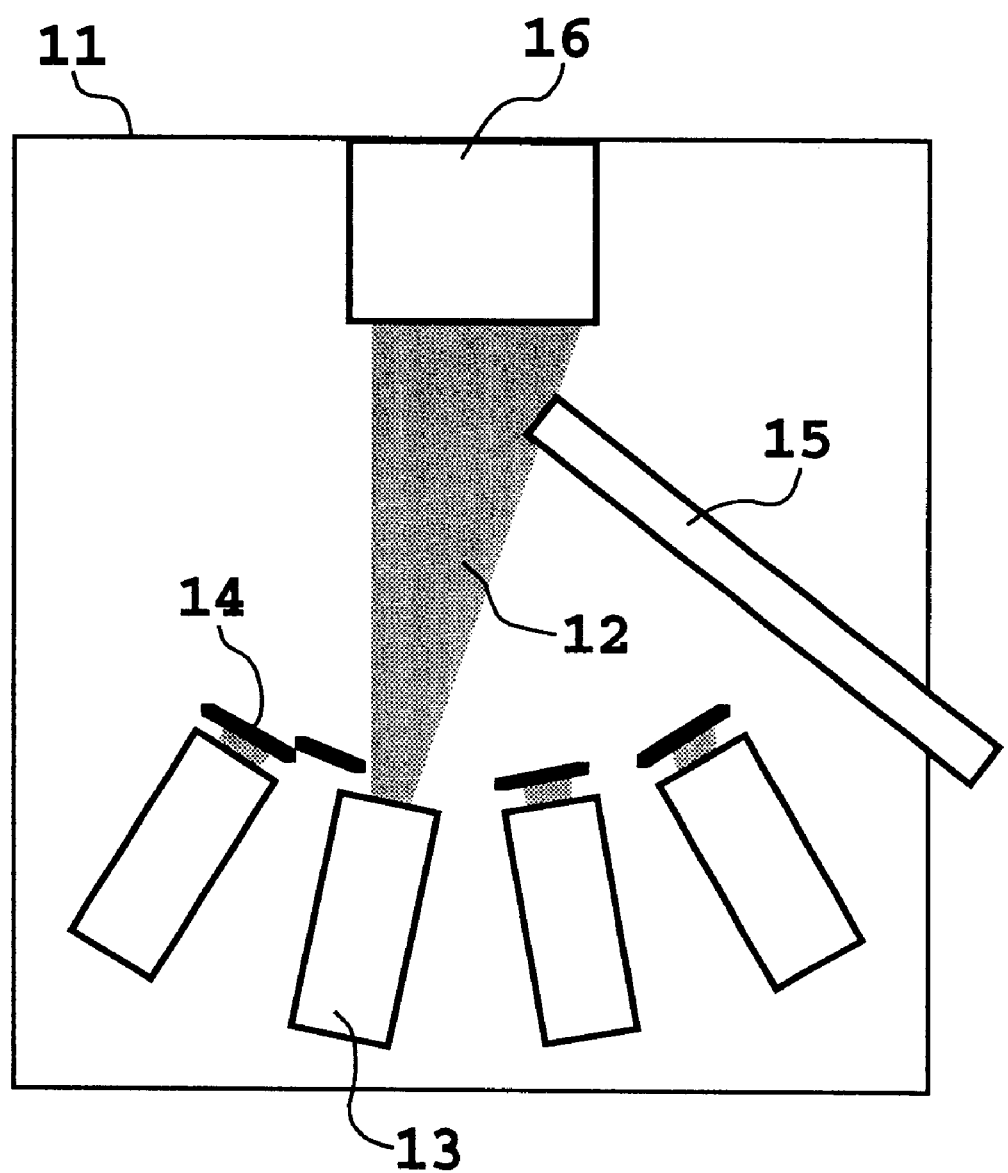
FIG. 6 illustrates an example setup of a vacuum film-deposition apparatus used in the process of manufacturing the intrinsic Josephson superconducting tunnel junction device according to the present invention.

In FIG. 6, reference number 11 represents a vacuum chamber, 4 represents a substrate over which films are formed, 12 represents atoms of various kinds to be supplied for the substrate 4, 13 represents a source for generating the atoms 12 of various kinds to be supplied, 14 represents a shutter for controlling the amount of atoms being supplied, 15 is an oxidizing gas introduction portion for introducing an oxidizing gas, and 16 is a heater for keeping the substrate 4 at an appropriate temperature for forming the thin films. In FIG. 6, an apparatus for observing the morphology of the thin film being formed, an apparatus for measuring the amount of atoms being supplied, and an exhaust apparatus are not shown.

Various kinds of atoms 12, which are constitutional elements of the films, are supplied in appropriate amounts from the atom source 13 to the surface of the substrate 4 where an atom layer is deposited. At this time, a gas such as ozone that has an oxidizing action is supplied from the oxidizing gas introduction portion, thus forming an oxide. The amounts of the atoms 12 of various kinds are controlled such that the atom layers are formed to predetermined thicknesses.

The technique for controlling the amounts of atoms being supplied may employ the "method for measuring the amount of atoms irradiated in the vacuum deposition apparatus by the atomic absorption spectroscopy" by the inventor of this invention, disclosed in Japanese Patent Application Laid-open No. 10-132736 (1998) ("Method of measuring atomic beam flux rate in film growth apparatus", U.S. Pat. No. 5,886,778).

In manufacturing thin films of oxide superconductor with the method using the above-mentioned vacuum deposition apparatus, two methods are available: one is to sequentially supply thin film constitutional elements that are other than oxygen, one kind at a time; and one is to supply a plurality of elements forming the thin film at the same time. In the sequential element supply method, the order of opening and closing the shutters needs to be determined as follows.

When manufacturing the oxide superconductor thin films 1F and 3F, the opening and closing of the shutters 14 of the atom sources is controlled such that the shutters 14 are opened in the order of Bi, Sr, Cu, Ca, Cu and Sr. This sequence of opening and closing is repeated to form the films whose thickness corresponds to the number of repetitions.

When manufacturing the oxide superconductor thin film 2F, the opening and closing of the shutters 14 of the atom sources is controlled such that the shutters 14 are opened in the order of Bi, Sr, Cu, Ca, Y, Cu and Sr. This sequence of opening and closing is repeated to form the film whose thickness corresponds to the number of repetitions. The order of Ca and Y may be reversed.

In the method of supplying a plurality of elements at the same time, the kind and amount of atom to be supplied are changed according to the composition of the film to be made, i.e., depending on whether the film to be formed is the oxide superconductor thin films 1F and 3F not containing yttrium (Y) or the oxide superconductor thin film 2F containing yttrium (Y). For example, in the case of the laser abrasion method, two targets (two atom sources) of different compositions, one containing yttrium (Y) and one not containing it, are prepared and an appropriate target is selected according to the kind of a thin film to be formed.

In this way, the thin films of hetero structure as shown in FIG. 5 are formed. It is preferred that a protective film of gold (Au) be formed over the hetero-structured thin film, as the protective film can prevent degradation of the superconductor during the subsequent manufacturing processes of the superconducting tunnel junction. It is possible to provide an appropriate buffer layer between the substrate 4 and the oxide superconductor thin film 1F.

Next, using the photolithography technique the hetero-structured thin film of FIG. 5 is processed to form the superconducting tunnel junction device of the structure shown in FIG. 3. That is, a photoresist pattern of mesa structure portion is formed over the hetero-structured thin film and is subjected to dry etching as by argon ion milling or to wet etching using a solution containing iodine to form the mesa structure portion. Similarly, using the photolithography, the insulator 7 and the electrodes 5 and 6 are formed. In forming the insulator 7, the photoresist pattern of the mesa structure portion may be used as is to utilize the self-alignment technique.

With the procedure described above, the superconducting tunnel junction device can be manufactured.

Here, because the characteristic of the superconducting tunnel junction can be controlled by adjusting the amount of yttrium (Y) to be added and because the number of stacks in the superconducting tunnel junction can be controlled only by the thickness of the oxide superconductor thin film 2F and does not depend on the height of the mesa structure, the control of etch depth during the process of making the mesa structure does not require high precision, allowing the mesa structure to be fabricated with much greater ease than in the conventional method.

Further, the oxide superconductors 1 and 3 in FIG. 3 are not limited to bismuth-based oxide superconductors not containing yttrium (Y) but may be any oxide superconductors that are epitaxially grown on a bismuth-based oxide superconductor containing yttrium (Y). The crystal orientations of the oxide superconductors 1 and 3 may be different from that of the oxide superconductor 2.

Similarly, in the method of manufacturing the superconducting tunnel junction device, the oxide superconductor thin films 1F and 3F in the hetero-structured film may be any oxide superconductors epitaxially grown over the bismuth-based oxide superconductor thin film 2F containing yttrium (Y).

With this embodiment, it is possible to realize a superconducting tunnel junction device having an excellent characteristic as in the previous embodiment, and also a method of manufacturing such a device.

Although in the preceding embodiments the bismuth-based oxide superconductors have been described not to contain lead (Pb), they may have a part of bismuth (Bi) replaced with Pb.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. An intrinsic Josephson superconducting tunnel junction device including an oxide superconductor expressed by a general expression (I): $Bi_{2-z}Pb_zSr_2Ca_{n(1-x)}R_{nx}Cu_{n+1}O_{2n+6}$ ($n \geq 1$, $0 < x \leq 0.2$, $0 \leq z \leq 1.0$, R: rare-earth element).

2. An intrinsic Josephson superconducting tunnel junction device according to claim 1, wherein in the general expression (I), R is yttrium (Y).

3. An intrinsic Josephson superconducting tunnel junction device according to claim 1, wherein in the general expression (I), n is 1.

4. An intrinsic Josephson superconducting tunnel junction device according to claim 1, wherein a layer of the oxide superconductor is stacked at each side with other oxide superconductors.

5. An intrinsic Josephson superconducting tunnel junction device according to claim 1, wherein a structure of the junction device is a mesa structure.

6. An intrinsic Josephson superconducting tunnel junction device according to claim 2, wherein in the general expression (I), n is 1.

7. An intrinsic Josephson superconducting tunnel junction device according to claim 2, wherein a layer of the oxide superconductor is stacked at each side with other oxide superconductors.

8. An intrinsic Josephson superconducting tunnel junction device according to claim 2, wherein a structure of the junction device is a mesa structure.

9. An intrinsic Josephson superconducting tunnel junction device according to claim 7, wherein the other oxide superconductors are Bi-based oxide superconductors having Bi, Sr, Ca, Cu and O as its main components.

10. An intrinsic Josephson superconducting tunnel junction device according to claim 7, wherein a structure of the junction device is a mesa structure.

11. An intrinsic Josephson superconducting tunnel junction device according to claim 9, wherein the Bi-based oxide superconductor has a composition expressed by a general expression (II): $Bi_2Sr_2Ca_1Cu_2O_8$.

12. An intrinsic Josephson superconducting tunnel junction device according to claim 11, wherein a structure of the junction device is a mesa structure.

13. An intrinsic Josephson superconducting tunnel junction device according to claim 3, wherein a layer of the oxide superconductor is stacked at each side with other oxide superconductors.

14. An intrinsic Josephson superconducting tunnel junction device according to claim 3, wherein a structure of the junction device is a mesa structure.

15. An intrinsic Josephson superconducting tunnel junction device according to claim 13, wherein the other oxide superconductors are Bi-based oxide superconductors having Bi, Sr, Ca, Cu and O as its main components.

16. An intrinsic Josephson superconducting tunnel junction device according to claim 15, wherein a structure of the junction device is a mesa structure.

17. An intrinsic Josephson superconducting tunnel junction device according to claim 15, wherein the Bi-based oxide superconductor has a composition expressed by a general expression (II): $Bi_2Sr_2Ca_1Cu_2O_8$.

18. An intrinsic Josephson superconducting tunnel junction device according to claim 17, wherein a structure of the junction device is a mesa structure.

19. An intrinsic Josephson superconducting tunnel junction device according to claim 4, wherein the other oxide superconductors are Bi-based oxide superconductors having Bi, Sr, Ca, Cu and O as its main components.

20. An intrinsic Josephson superconducting tunnel junction device according to claim 4, wherein a structure of the junction device is a mesa structure.

21. An intrinsic Josephson superconducting tunnel junction device according to claim 19, wherein a structure of the junction device is a mesa structure.

22. An intrinsic Josephson superconducting tunnel junction device according to claim 19, wherein the Bi-based oxide superconductor has a composition expressed by a general expression (II): $Bi_2Sr_2Ca_1Cu_2O_8$.

23. An intrinsic Josephson superconducting tunnel junction device according to claim 22, wherein a structure of the junction device is a mesa structure.

* * * * *